(12) United States Patent
Gulde et al.

(10) Patent No.: US 12,151,734 B2
(45) Date of Patent: Nov. 26, 2024

(54) VEHICLE STEERING WHEEL

(71) Applicant: Autoliv Development AB, Vargarda (SE)

(72) Inventors: Alexander Gulde, Haimhausen (DE); Alexandre Portier, Chire-en-Montreuil (FR)

(73) Assignee: Autoliv Development AB, Vårgårda (SE)

( * ) Notice: Subject to any disclaimer, the term of this patent is extended or adjusted under 35 U.S.C. 154(b) by 386 days.

(21) Appl. No.: 17/753,117

(22) PCT Filed: Aug. 19, 2020

(86) PCT No.: PCT/EP2020/073210
§ 371 (c)(1),
(2) Date: Feb. 18, 2022

(87) PCT Pub. No.: WO2021/037636
PCT Pub. Date: Mar. 4, 2021

(65) Prior Publication Data
US 2022/0340191 A1 Oct. 27, 2022

(30) Foreign Application Priority Data
Aug. 23, 2019 (FR) ........................................ 1909375

(51) Int. Cl.
*B62D 1/04* (2006.01)
*B62D 1/06* (2006.01)
(Continued)

(52) U.S. Cl.
CPC ............... *B62D 1/046* (2013.01); *B62D 1/06* (2013.01); *G01D 5/24* (2013.01); *H03K 2017/9602* (2013.01)

(58) Field of Classification Search
CPC .. B60L 2250/00; H03K 17/945; H03K 17/96; H03K 17/9602; H03K 17/9604; H03K 17/962; H03K 17/9622; H03K 17/975; H03K 2017/9602; G01D 5/24; B60W 2422/50; B60K 2026/00; B60K 2026/028;
(Continued)

(56) References Cited

U.S. PATENT DOCUMENTS 11,136,056 B2 10/2021 Wittkowski et al.
2015/0369633 A1 12/2015 Karasawa et al.
(Continued)

FOREIGN PATENT DOCUMENTS

DE 102017111297 A1 6/2018
EP 2955737 A1 12/2015

*Primary Examiner* — Anthony R Jimenez
(74) *Attorney, Agent, or Firm* — Matthew D. Thayne; Thayne and Davis LLC

(57) ABSTRACT

A vehicle steering wheel having a gripping portion to be grasped by a user, a capacitive device for detecting a contact between a member of the user and the gripping portion, comprising at least one detection electrode arranged under an outer surface of the gripping portion, wherein the detection electrode defines, on the outer surface, a detection area, and a dead area complementary to the detection area, wherein the detection device has at least one conductive strip attached on the detection electrode having at least one covering portion arranged opposite the detection area and at least one extension portion arranged opposite the dead area.

14 Claims, 3 Drawing Sheets

(51) Int. Cl.
  *G01D 5/24* (2006.01)
  *H03K 17/96* (2006.01)
(58) Field of Classification Search
  CPC ... B62D 1/00; B62D 1/02; B62D 1/04; B62D
      1/046; B62D 1/06; B62D 1/08; B62D
      1/105; B62D 1/12; B62D 1/14; B62D
      1/16; B62D 1/28; B60R 16/02; H01H
      25/04; H01H 11/00; B60Q 1/1469; B60Q
      1/1476; B60Q 1/1453; B60Q 1/1461;
      B60Q 1/1484; B60Q 1/34
  USPC ........................................................ 200/61.54
  See application file for complete search history.

(56) References Cited

U.S. PATENT DOCUMENTS

2017/0355391 A1    12/2017  Wittkowski et al.
2018/0354543 A1    12/2018  Nishio et al.
2021/0371001 A1*   12/2021  Osako .................... B62D 1/046

\* cited by examiner

[Fig. 1]
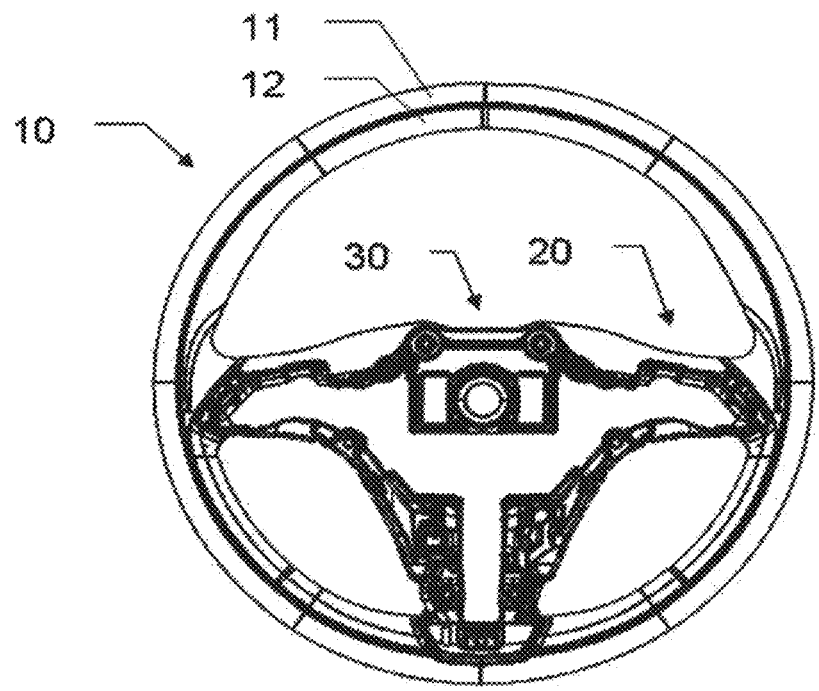
[Fig 2]
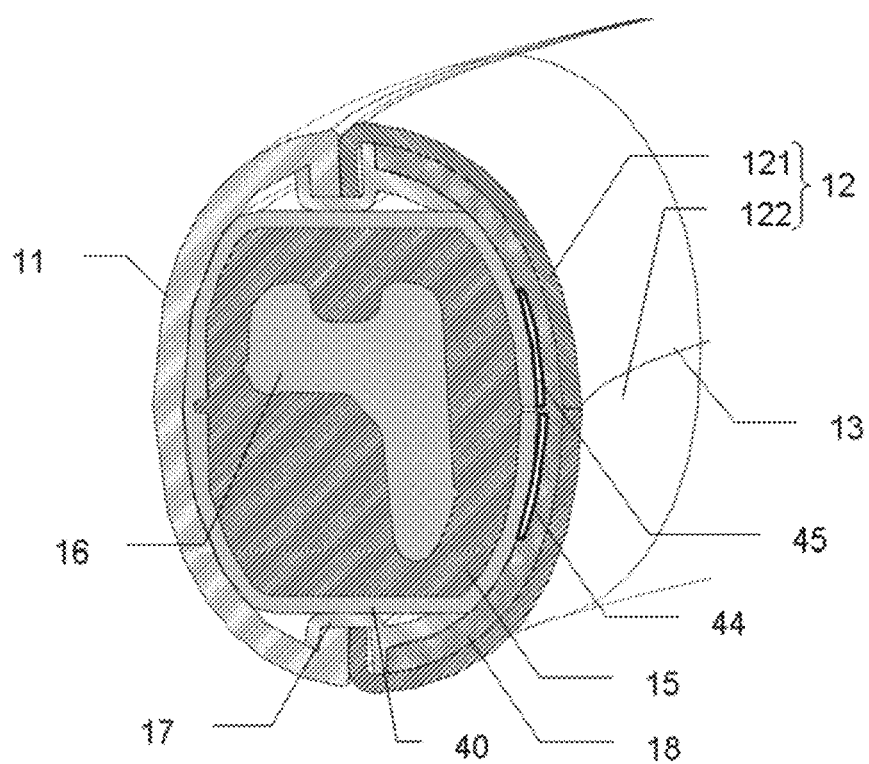

[Fig. 3]
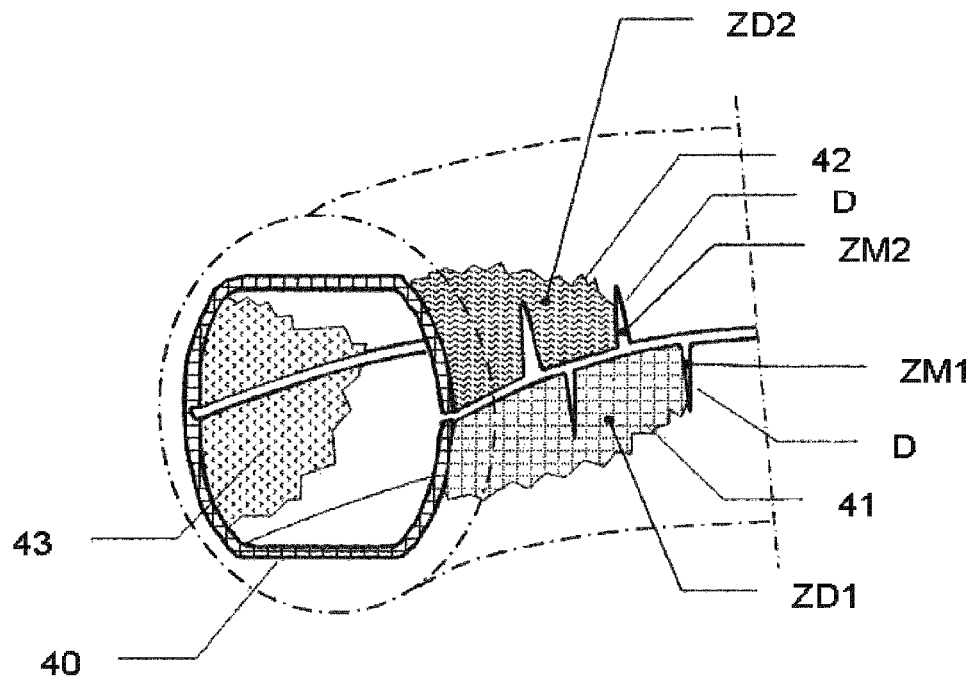
[Fig. 4]
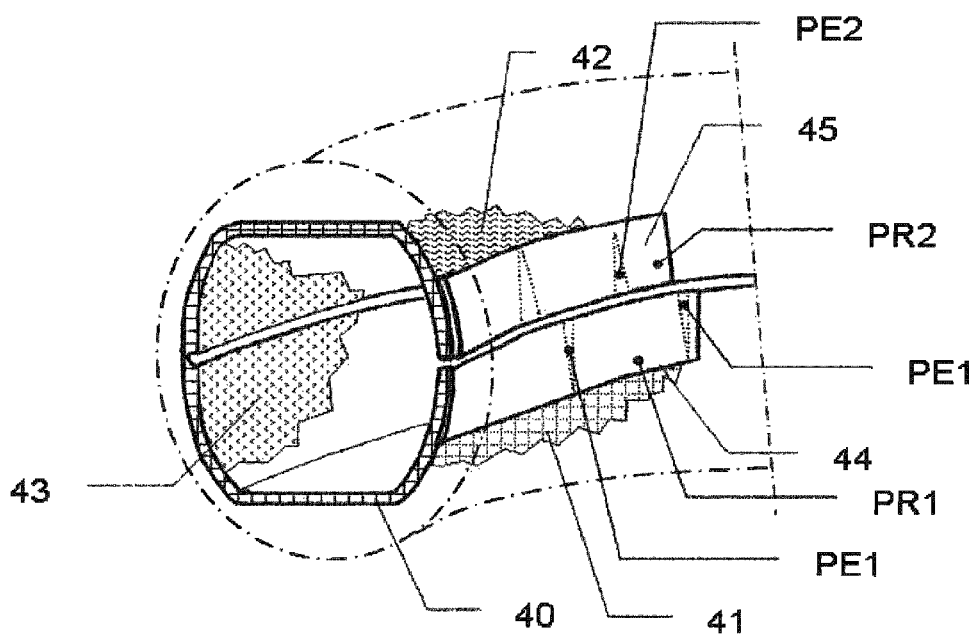

[Fig. 5]
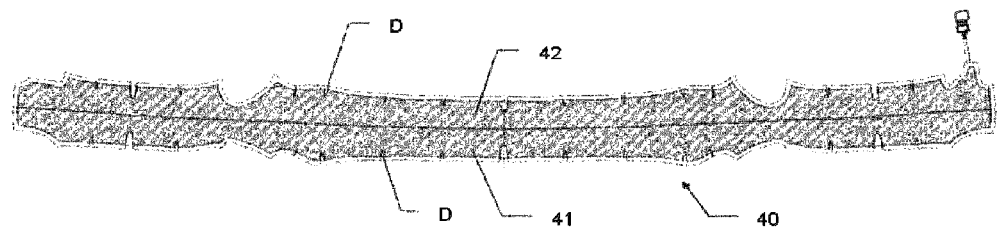
[Fig. 6]
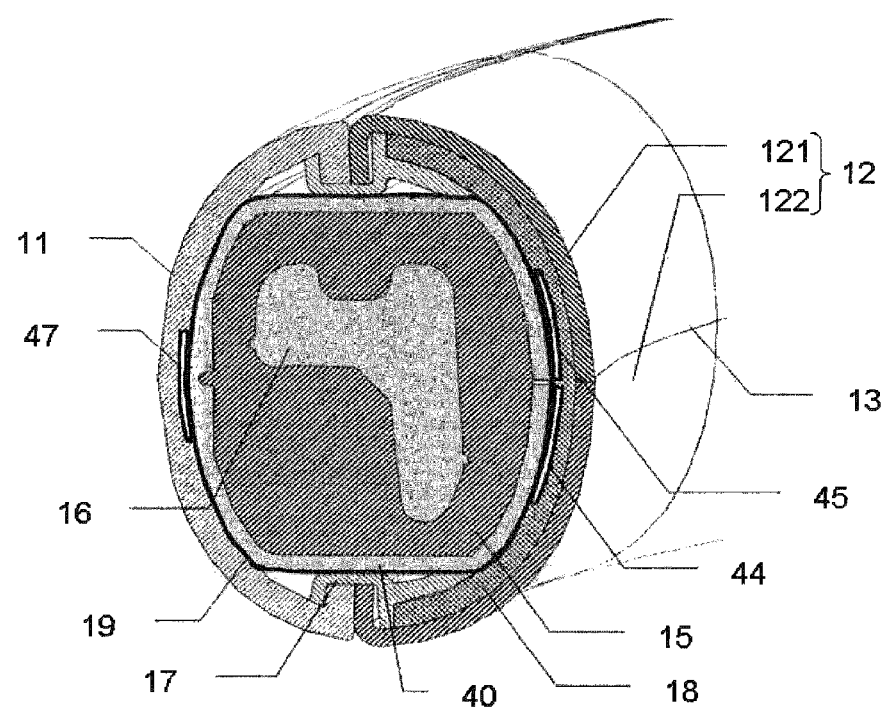

VEHICLE STEERING WHEEL

The present invention relates generally to a vehicle steering wheel, and in particular, to a vehicle steering wheel equipped with a device for detecting contact or proximity between a gripping portion of the steering wheel (for example, the rim) and a user's member (for example, a finger, hand, or palm).

It is known in the prior art that steering wheels are equipped with devices for detecting contact or proximity between a gripping portion of the steering wheel and a user's member. Typically, the detection device comprises a flexible detection electrode to be disposed under an outer surface of the rim. However, it may happen that due to geometric bending or manufacturing reasons, the detection electrode has cuts or interruptions that create a dead area on the outer surface, in which a contact or proximity between a gripping portion of the steering wheel and a user's member will not be detected.

An aim of the present invention is to address the above-mentioned drawbacks of the prior art and in particular, firstly, to provide a vehicle steering wheel equipped with a detection device comprising a detection electrode, and which has a reduced dead area, even if the geometry of the steering wheel requires cuts or interruptions in the detection electrode.

A first aspect of the invention therefore relates to a vehicle steering wheel comprising:
 a gripping portion to be grasped by a user,
 a capacitive device for detecting contact or proximity between a user's member and the gripping portion, comprising at least one detection electrode arranged under an outer surface of the gripping portion,
wherein the detection electrode defines on the outer surface:
 a detection area, and
 a dead area complementary to the detection area,
characterized in that the detection device comprises at least one conductive strip attached on the detection electrode, comprising at least one covering portion arranged opposite the detection area and at least one extension portion arranged opposite the dead area.

The steering wheel according to the above embodiment comprises an attached conductive strip, which "extends" the detection area. Indeed, the covering portion facing the detection electrode reflects or transmits to the latter any modifications (of electric field or of charge or of capacity) imposed on the extension portion. As a result, the attached conductive strip, via the extension portion, can detect proximity or contact of the user with the outer surface, even in the initial dead area, which is referred to as an extended detection area. Indeed, in the present application, the detection area refers to the area where a contact or proximity is detected by the detection electrode itself. The detection area is directly opposite an "active" surface of the detection electrode.

The extended detection area encompasses or includes the detection area, and the area(s) where an extension portion makes it possible to detect (by antenna effect and/or by conduction and/or by capacitive effect, via the extension portion and the covering portion) the occupant. An attached conductive strip is a strip to be applied after the detection electrode has been placed. In addition, an attached conductive strip is a strip that conducts electricity.

According to an alternative embodiment, the detection device may be a resistive device.

According to one embodiment, the attached conductive strip can be removable, independent, complementary, and distinct from the detection electrode.

According to one embodiment, the attached conductive strip can be arranged between the detection electrode and the outer surface.

According to one embodiment, the attached conductive tape insert may comprise an electrically conductive layer and an adhesive layer. Typically, the attached conductive strip can be an adhesive metal strip.

According to one embodiment, the adhesive layer can be electrically insulating.

According to an alternative embodiment, the adhesive layer can be electrically conductive.

According to one embodiment, the conductive layer can be made of aluminum.

According to one embodiment, the conductive layer can have a thickness between 50 μm and 250 μm.

According to one embodiment, the adhesive layer may be in contact with the detection electrode. In other words, the attached conductive strip is glued directly to the detection electrode.

According to an embodiment, the gripping portion may comprise a rim, the vehicle steering wheel comprising a sheath arranged around the rim and at least partially overlapping the detection device.

According to one embodiment, the sheath may comprise at least a first, rigid portion, such as wood, and at least a second, flexible portion, such as leather. Such a composite sheath may require cuts and/or folds at the detection electrode, which leads to a smaller detection area and a correspondingly larger dead area. Bringing conductive strips back onto the detection electrode so that there are extension portions at the dead area provides an extended detection area and ensures that the proximity or contact of the occupant's member is detected even in the initial dead area.

According to one embodiment, the device may comprise at least two detection electrodes, each detection electrode defining on the outer surface:
 a detection area, and
 a dead area complementary to the detection area.

According to the above embodiment, the steering wheel comprises two distinct detection areas, for example in front and behind the rim. It can also be provided to detect the right and left sides separately. Alternatively, more than two separate detection areas may be provided.

According to one embodiment, the steering wheel or detection device may comprise several attached conductive strips, each attached conductive strip comprising at least one covering portion arranged opposite the detection area of a detection electrode and at least one extension portion arranged opposite the dead area.

According to one embodiment, each covering portion of each attached conductive strip can exclusively face a detection area of the same detection electrode. In other words, an attached conductive strip covers only one detection electrode.

According to one embodiment, an extension portion of an attached conductive strip whose covering portion may face a detection area of a detection electrode may be separated by a strictly positive distance from an extension portion of another attached conductive strip whose covering portion may face a detection area of another detection electrode. In other words, two attached conductive strips, each dedicated to a different detection electrode, do not overlap or touch each other.

According to one embodiment, said attached conductive strip may comprise:
- two covering portions each arranged opposite the detection area of the same detection electrode,
- an extension portion, arranged opposite the dead area.

Thus, an attached conductive strip forms a bridge between two portions of the same detection area, for example to cover a cutout or slot in the detection electrode.

According to one embodiment, the detection device may comprise
- at least one shielding electrode,
- a dielectric, wherein:
- the detection electrode is arranged between the shielding electrode and the outer surface,
- the dielectric is arranged between the detection electrode and the shielding electrode,
- the shielding electrode defines an active shielding area on the outer surface, and wherein at least one extension portion of an attached conductive strip is arranged in a area complementary to the active shielding area. Typically, a capacitive detection device is similar to a capacitor, with a detection electrode facing a shielding electrode: the two electrodes have essentially the same surface area, and are separated by the dielectric. According to the above embodiment, there is no need to provide a shielding electrode opposite the extension portions of the attached conductive strips. Surprisingly, detection is possible even without a shielding electrode.

According to one embodiment, the attached conductive strip can be distinct from the detection electrode.

A second aspect of the invention relates to an automotive vehicle comprising a vehicle steering wheel according to the first aspect.

A third aspect of the invention relates to a detection device for a vehicle steering wheel according to the first aspect, comprising at least one detection electrode and at least one attached conductive strip.

A fourth aspect of the invention relates to a method of manufacturing a vehicle steering wheel comprising the steps of:
- positioning at least one detection electrode on a core of a gripping portion of the steering wheel,
- positioning at least one attached conductive strip on the core of the gripping portion, so as to
- position a covering portion of the attached conductive strip opposite the detection electrode,
- positioning an extension portion of the attached conductive strip on a complementary area of the detection electrode,
- covering the gripping portion so as to define an outer surface to be gripped by a user.

The above method forms an extended detection area once the detection electrode is placed on the steering wheel. This is because the attached conductive strips are applied after the detection electrode has been positioned, which makes it possible to adapt to each particular steering wheel geometry and to form the largest possible extended detection area, even if the detection electrode has to have a limited surface area due to cuts and/or folds.

It is understood that all of the above technical features may be combined with or separated from each other as long as there are no technical inconsistencies or incompatibilities.

Other characteristics and advantages of the present invention will become more apparent upon reading the detailed description of several embodiments of the invention, which are provided by way of example but in no manner limited thereto, and illustrated by the attached drawings, in which:

FIG. 1 shows a steering wheel according to the invention, comprising a rim, connected to a hub by branches;

FIG. 2 shows a cross-section of the rim of the steering wheel of FIG. 1;

FIG. 3 shows a schematic view of a detection layer of the rim of FIG. 2, before the installation of attached conductive strips;

FIG. 4 shows a schematic view of a detection layer of the rim of FIG. 2, after the installation of attached conductive strips;

FIG. 5 shows a general view of the detection layer of FIGS. 3 and 4;

FIG. 6 shows the cross-section of the rim of the steering wheel in FIG. 2 in an alternative embodiment.

FIG. 1 shows a view of a vehicle steering wheel that comprises a rim 10, connected to a hub 30 by branches 20. In the shown embodiment, the rim 10, which forms a gripping portion to be grasped by a user, includes a composite sheath that forms its outer surface. In fact, an outer sheath of the rim 10 is formed by a first part 11 which is a rigid wooden shell and by a second part 12 made of leather. The combination of wood and leather is mentioned only as an example and is not limiting to the invention, which concerns the extension of the detection surface of an electrode.

As shown in FIG. 2 in cross-section, the second part 12 is actually formed by two pieces of leather 121 and 122 connected by a seam 13 arranged along an inner perimeter of the rim 10. Furthermore, the first part 11 and the second part 12 are connected to each other by means of inserts 17 housed on either side of the rim 10, above a detection layer 40. This detection layer 40 is itself wound around a rim body formed by a frame 16 overmolded with an overmolding material 15. Typically, the detection layer 40 is part of a detection device that also includes an electronic computing unit for measuring and analyzing the electrical signals and characteristics of the detection layer 40. A foam sheet 18 may be provided between the second portion 12 and the detection layer 40.

In addition, FIG. 2 shows two attached conductive strips 44 and 45 arranged between the detection layer 40 and the foam sheet 18, as explained below.

As shown in FIG. 5, the detection layer 40 has a complex shape with a tortuous perimeter to allow sheathing around the rim body without forming folds visible to the user. In particular, numerous cut-outs D are provided along the perimeter, to avoid folds and over-lengths leading to overlaps.

Further, as shown in FIG. 3, the detection layer 40 comprises a first detection electrode 41 and a second detection electrode 42 arranged on an outer face of the detection layer 40. The outer silhouette of the rim 10 is shown in mixed lines, to show the overall arrangement.

It is possible to form the detection electrodes 41 and 42 by printing, gluing or any other known method. One or more shielding electrode(s) 43 is provided on the inner side of the detection layer 40, so as to provide a capacitive device for detecting proximity or contact between the rim and a user's member. Between the detection electrodes 41, 42 and the shielding electrode(s) 43, a dielectric is provided to insulate the electrodes from each other.

With reference to the cut-outs D shown in FIG. 5, we can note the consequence of their presence in FIG. 3 which shows the detection layer installed on the rim body. Indeed, the cut-outs D, necessary to avoid folds and overlaps, nevertheless lead the area of detection area to decrease.

In particular, the first detection electrode 41 defines on the outer surface of the rim a detection area ZD1 in which a contact or proximity of the user will be detected. On the other hand, opposite the cut-outs D, a dead area ZM1 is present, and the user's contact or proximity will not be detected. The same applies to the second detection electrode 42: the latter defines a detection area ZD2 and a dead area ZM2 at the cut-outs D.

The presence of dead areas ZM1 and ZM2 alters the detection accuracy, and the invention proposes to reduce these dead areas as much as possible. As shown in FIG. 4, conductive strips 44 and 45 are attached on each of the electrodes, in particular at the cut-outs D.

In detail, a first attached conductive strip 44 is positioned on the first detection electrode 41, with a covering portion PR1 facing the first detection area ZD1, and an extension portion PE1 which faces each cutout D. Thus, the detection area ZD1 is extended, because by antenna effect, and/or conduction, and/or capacitive phenomenon, the extension portion PE1, connected to the covering portion PR1, will allow the first detection electrode 41, to detect contact or proximity with a user's member, in the area facing the cut-out D, which defines an extended detection area. Such an extended detection area therefore includes the original detection area ZD1, and also the dead areas ZM1 opposite the cut-outs D.

The same applies to the second detection electrode 42: a second attached conductive strip is positioned on the second detection electrode 41, with a covering portion PR2 facing the second detection area ZD2, and an extension portion PE2 which faces each cut-out D.

For the attached conductive strip 44 or 45, aluminum adhesive tape can be provided, for example with an aluminum thickness of between 50 μm and 250 μm. Other conductive materials (copper, carbon, alloy with tin, metallisation, etc.) can be provided. The thickness and materials will be chosen so that the tape is not visible to the user. A layer of adhesive is provided to ensure easy assembly. As a result, there may or may not be direct contact between the conductive foil and the detection electrode. For example, the electrical resistance between the conductive foil of the attached conductive strip and the detection electrode may be zero (direct contact) or may be a few Ohms, a few tens of Ohms, or hundreds of Ohms.

The attached strips 44 and 45 do not contact or overlap one another. Indeed, two distinct detection electrodes 41 and 42 are provided, whose function is to be able to tell apart contact between, for example, the front and rear of the steering wheel, or the right and left. So, to ensure this distinction, each attached conductive strip of a detection electrode does not overlap or overlap another detection electrode or an attached conductive strip bonded to another detection electrode. For safety reasons, a gap of a few millimeters can be left between the attached conductive strips 44 and 45.

The assembly or manufacture of the steering wheel remains flexible and easy, because after having positioned the detection layer 40, it is sufficient to position attached conductive strips 44, 45 on each dead area that one wishes to eliminate, and this in a specific way: it is possible to adapt the extended detection area even if the pre-existing detection layer has numerous cuts to avoid folds, which would normally generate significant dead areas.

FIG. 6 shows an alternative embodiment of the steering wheel shown in FIG. 2. Indeed, it is possible to provide an intermediate layer between the detection layer 40 and the outer composite sheath (the first part 11 and/or the second part 12). In particular, it is foreseen in FIG. 6 to protect the detection layer 40 with a protective sheath 19 and to attach the attached conductive strips 44 and 45 above this protective sheath 19.

Alternatively, it can be provided that the protective layer is integrated into the detection layer. For example, a coating can be applied to the surface(s) of the detection layer 40, so as to cover (preferably completely) the detection electrode(s) 41, 42 and even the shielding electrode 43 during the manufacturing steps.

For example, a sheet or layer of polyurethane a few tenths of a millimeter thick, or even less, can be used to form the protective sheath 19 and effectively protect the detection layer 40.

It is also possible to position attached conductive strips 47 opposite the first part 11 as shown in FIG. 6.

It will be understood that different modifications and/or improvements which are obvious for the person skilled in the art may be made to the different embodiments of the invention described in the present description without departing from the scope of the invention.

In particular, a wood/leather composite sheath is mentioned, but an all-leather (natural or synthetic) or all-wood outer sheath, or with other materials, can be provided.

The invention claimed is:

1. A vehicle steering wheel comprising:
a gripping portion to be grasped by a user,
a capacitive device for detecting a contact or proximity between a member of the user and the gripping portion, comprising at least one detection electrode arranged under an outer surface of the gripping portion,
wherein the detection electrode defines on the outer surface:
a detection area, and
a dead area complementary to the detection area,
wherein the capacitive device comprises at least one conductive strip attached on the detection electrode, comprising at least one covering portion arranged opposite the detection area and at least one extension portion arranged opposite the dead area.

2. The vehicle steering wheel according to claim 1, wherein the at least one conductive strip is arranged between the detection electrode and the outer surface.

3. The vehicle steering wheel according to claim 1, wherein the gripping portion comprises a rim, the vehicle steering wheel comprising a sheath arranged around the rim and at least partially overlapping the capacitive device.

4. The vehicle steering wheel according to claim 1, wherein said attached conductive strip comprises:
two covering portions each arranged opposite the detection area of a single detection electrode,
an extension portion, arranged opposite the dead area.

5. The vehicle steering wheel according to claim 1, wherein the detection device comprises
at least one shielding electrode,
a dielectric,
wherein:
the detection electrode is arranged between the shielding electrode and the outer surface,
the dielectric is arranged between the detection electrode and the shielding electrode,
the shielding electrode defines an active shielding area on the outer surface, and wherein at least one extension portion of an attached conductive strip is arranged in an area complementary to the active shielding area.

6. The vehicle steering wheel according to claim 1 in combination with an automotive vehicle.

7. The vehicle steering wheel according to claim 1, wherein the attached conductive strip comprises a conductive layer of electricity and an adhesive layer.

8. The vehicle steering wheel according to claim 7, wherein the conductive layer is made of aluminum.

9. The vehicle steering wheel according to claim 7, wherein the conductive layer has a thickness between 50 μm and 250 μm.

10. The vehicle steering wheel according to claim 7, wherein the adhesive layer is in contact with the detection electrode.

11. The vehicle steering wheel according to claim 1, wherein the capacitive device comprises:
   at least two detection electrodes including the detection electrode, each detection electrode defining on the outer surface thereof:
   a detection area, and
   a dead area complementary to the detection area.

12. The vehicle steering wheel according to claim 11, further comprising a plurality of attached conductive strips, wherein each covering portion of each attached conductive strip faces exclusively a detection area of a single detection electrode.

13. The vehicle steering wheel according to claim 11, further comprising a plurality of attached conductive strips, wherein an extension portion of an attached conductive strip whose covering portion faces a detection area of a detection electrode of the at least two detection electrodes is separated by a strictly positive distance from an extension portion of another attached conductive strip whose covering portion faces a detection area of another detection electrode.

14. A method of manufacturing a vehicle steering wheel comprising the steps of:
   positioning at least one detection electrode on a core of a gripping portion of the steering wheel,
   positioning at least one attached conductive strip on the core of the gripping portion, so as to
   position a covering portion of the attached conductive strip opposite the detection electrode,
   positioning an extension portion of the attached conductive strip on a complementary area of the detection electrode,
   covering the gripping portion so as to define an outer surface to be gripped by a user.

* * * * *